(12) United States Patent
Martines et al.

(10) Patent No.: US 7,548,098 B2
(45) Date of Patent: Jun. 16, 2009

(54) OUTPUT BUFFER CIRCUIT AND METHOD WITH SELF-ADAPTIVE DRIVING CAPABILITY

(75) Inventors: Ignazio Martines, Tremestieri Etneo (IT); Michele La Placa, Cef Alu' (IT)

(73) Assignee: STMicroelectronics S.r.l., Agrate Brianza (MI) (IT)

( * ) Notice: Subject to any disclaimer, the term of this patent is extended or adjusted under 35 U.S.C. 154(b) by 89 days.

(21) Appl. No.: 11/717,853

(22) Filed: Mar. 13, 2007

(65) Prior Publication Data
US 2007/0210839 A1    Sep. 13, 2007

(51) Int. Cl.
*H03B 21/00*    (2006.01)
(52) U.S. Cl. ....................................... 327/112; 327/108
(58) Field of Classification Search .................. 327/50, 327/77, 108, 111, 112
See application file for complete search history.

(56) References Cited

U.S. PATENT DOCUMENTS

| 6,256,235 | B1 * | 7/2001 | Lee ........................ 365/189.11 |
| 6,990,033 | B2 * | 1/2006 | Cho ........................... 365/222 |
| 7,135,896 | B2 * | 11/2006 | Kobayashi ................... 327/108 |

* cited by examiner

*Primary Examiner*—Dinh T. Le
(74) *Attorney, Agent, or Firm*—Lisa K. Jorgenson; Paul F. Rusyn; Graybeal Jackson LLP (57) ABSTRACT

An output buffer for providing a buffered current to a circuit load includes a plurality of operative stages, each one for generating a component of the buffered current and an enabling circuit for selectively enabling each operative stage. The output buffer further comprises at least one auxiliary stage and control means for measuring a control current that can be delivered by the at least one auxiliary stage and for activating the enabling means according to the measured control current.

23 Claims, 5 Drawing Sheets

OUTPUT BUFFER CIRCUIT AND METHOD WITH SELF-ADAPTIVE DRIVING CAPABILITY

PRIORITY CLAIM

This application claims priority from Italian patent application No. MI2006A000438, filed Mar. 13, 2006, which is incorporated herein by reference.

BACKGROUND

The present invention refers generally to the field of electronics and more specifically to output buffers for electronic circuits.

Output buffers are generally exploited for interfacing electronic circuits with the other external or outside circuits. For example, in an electronic system such as a computer system, which includes different circuits, the circuits interact with each other by means of a so-called system bus. Each electronic circuit of the system typically includes one or more output buffers, necessary for electrically insulating the circuit from the system bus. The output buffer performs additional functions, like amplifying the signals that have to be made available to the system bus and providing the electrical power (i.e., the current) needed for driving the capacitive load that is usually introduced by the bus. A very important parameter of each output buffer is its driving capability. With the term driving capability it is intended the highest speed with which a signal generated by the output buffer may switch.

For the purpose of assuring optimal performance, the driving capability of the output buffer has to take a specific value (possibly, adjustable according to the capacitive load).

However, the driving capability of an output buffer depends on the process parameters used for its production. Since such process parameters, like the gain and the threshold voltage of the transistors, may be subjected to non-negligible spreads, the driving capability of each output buffer may have a different and not predictable value. Furthermore, the driving capability depends on operative parameters, like the supply voltage and the temperature. The operative parameters may vary over time during the operation of the output buffer and, as a consequence, the driving capability may similarly vary over time.

A known solution provides the dimensioning of the output buffer according to the worst case operating conditions (i.e., with the lowest supply voltage, the highest temperature, the highest threshold voltage of the transistors and the lowest gain of the transistors). This guarantees that the output buffer has a driving capability always higher than the desired value.

However, the possibility of being in the worst operating condition for all the parameters is remote. Consequently, in the majority of the cases, the driving capability will be too high, thereby degrading the signal to noise-ratio of the output buffer. For this purpose, two solutions are usually exploited.

According to a first known solution, a continual monitoring of the supply voltage is performed, in such a way to correct the driving capability according to its variation. However, the correction that can be performed may be not accurate, since it is not known a priori the amount of current that each transistor can generate depending on its supply voltage. A second solution known in the art provides the realization of an output buffer structured as a current mirror. Indeed, ideally, the current mirror circuit structure is immune to the variations of temperature, process and supply voltage. However, such circuit structure is characterized by a response speed that is too slow for the specifics usually required for a modern output buffer.

SUMMARY

Particularly, an embodiment of the present invention relates to an output buffer for providing a buffered current to a circuit load. The output buffer includes a plurality of operative stages, each one for generating a component of the buffered current. An enabling means is used for selectively enabling each operative stage. The output buffer further includes one (or more) auxiliary stage. A control means is provided for measuring a control current that can be delivered by the auxiliary stage and for activating the enabling means according to the measured control current.

BRIEF DESCRIPTION OF THE DRAWINGS

The invention itself, however, as well as further features and the advantages thereof will be best understood by reference to the following detailed description of embodiments of the invention, given purely by way of a non-restrictive indication, to be read in conjunction with the accompanying drawings, wherein.

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
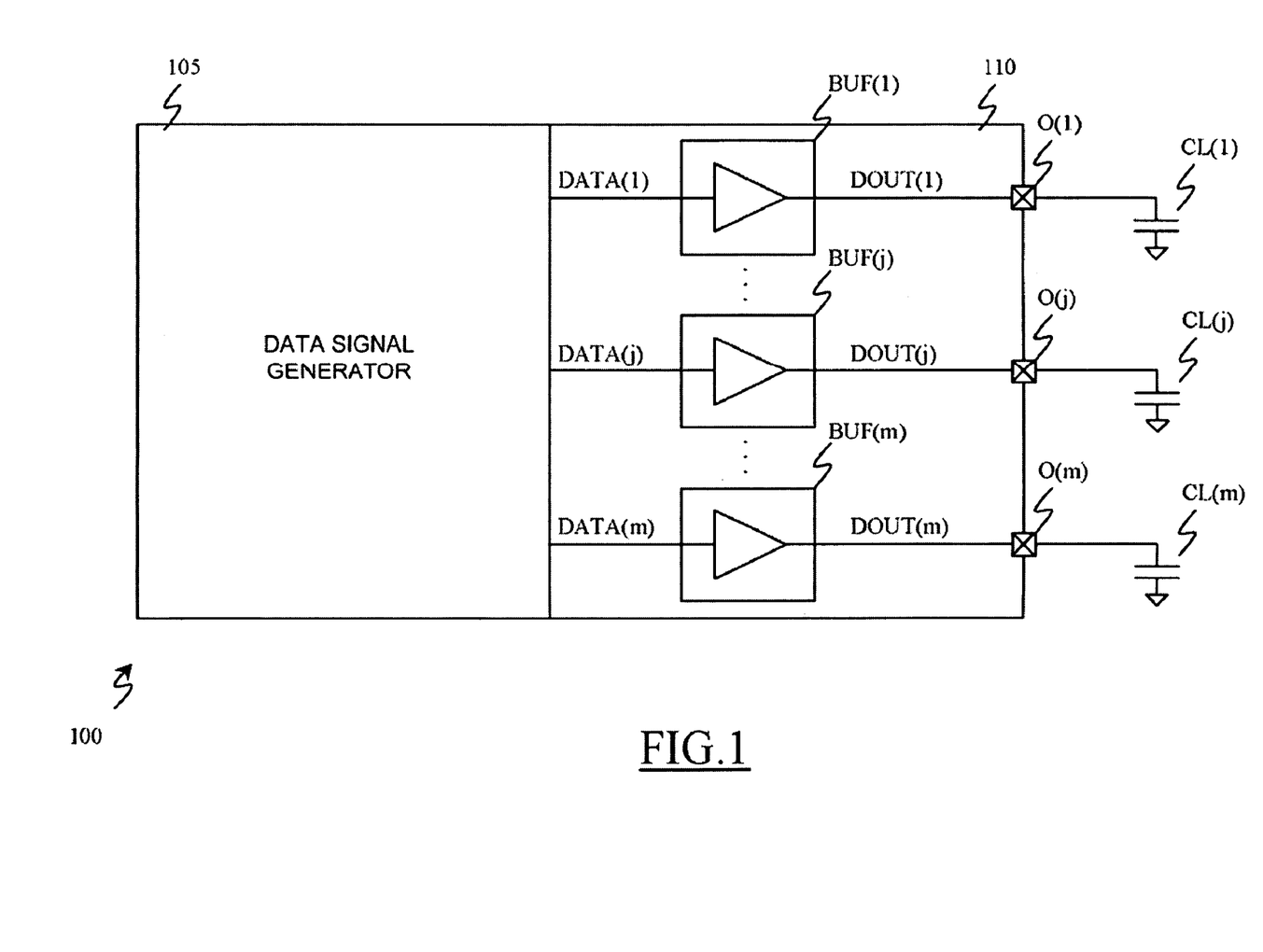
FIG. 1 schematically illustrates a generic electronic circuit that includes an output buffer section.

With reference in particular to FIG. 1, a generic electronic circuit 100 is schematically illustrated.

The electronic circuit 100 includes a main section 105, which generates a plurality of digital signals DATA(j) (j=1, 2, ..., m). Each digital signal DATA(j) is applied to a circuit load CL(j) outside the electronic circuit 100 by means of a corresponding output terminal O(j). For the purpose of simplifying the present description, each load CL(j) is depicted in the figure by means of an ideal capacitor.

The digital signals DATA(j) are provided to the output terminals O(j) through an output buffer section 110. The purpose of the output buffer section 110 is to electrically insulate the main section 105 from the loads CL(j) outside the electronic circuit 100. The output buffer section 110 includes an output buffer BUF(j) for each output terminal O(j). Particularly, each output buffer BUF(j) has an input terminal for receiving the digital signal DATA(j), and an output terminal for providing—to the output terminal O(j)—a corresponding buffered output signal DOUT(j) (i.e., an output signal properly modified according to the characteristics of the load CL(j) to which it is provided).

Figure 2:
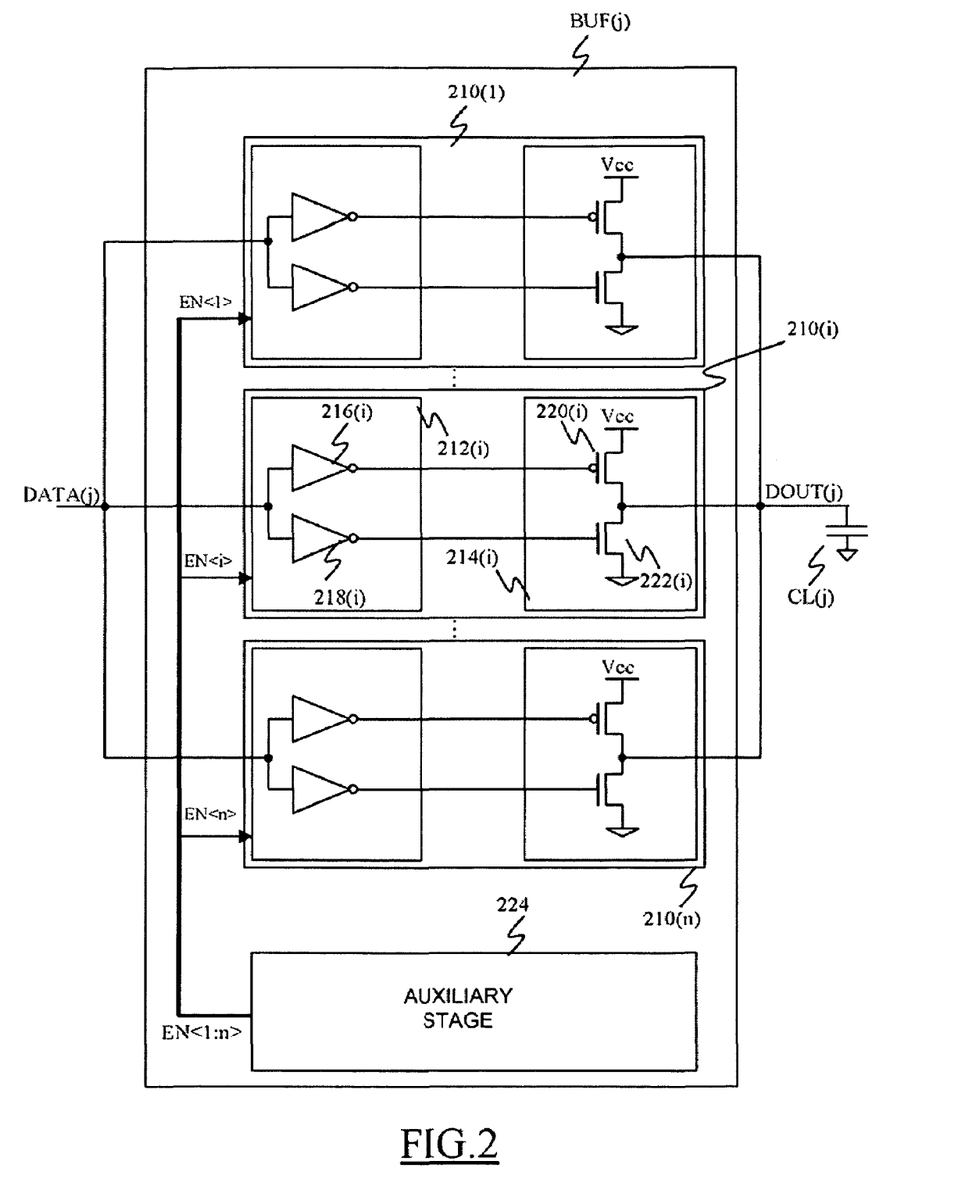
FIG. 2 shows the circuit structure of a generic output buffer included in an output buffer section according to an embodiment of the invention.

FIG. 2 illustrates in greater detail the circuit structure of a generic output buffer BUF(j) according to an embodiment of the present invention. The output buffer BUF(j) includes a plurality of operative stages 210(i) (i=1, 2, . . . , n) (for example, 10-30). The operative stages 210(i) are connected in parallel between the input terminal and the output terminal of the output buffer BUF(j). Each operative stage 210(i) generates a component of the total current drained by/provided to the load CL(j).

The driving capability of the output buffer BUF(j), i.e., the highest speed with which the buffered output signal DOUT(j) may switch, is determined by the amount of electric current that can be drained by/provided to the output terminals of the operative stages 210(i). The electric current is necessary for discharging/charging the capacitances at the output terminal of the output buffer BUF(j), which capacitances include the parasitic capacitances of the connection lines, the output capacitances of the operative stages 210(i) and the capacitance of the circuit load CL(j). By selectively activating or deactivating the operative stages 210(i) it is possible to vary the driving capability of the output buffer (BUF(j)).

All the operative stages 210(i) are structured in the same way. The generic operative stage 210(i) is composed by a pre-buffer section 212(i) being cascade connected to a main buffer section 214(i). The pre-buffer section 212(i) includes two inverters 216(i), 218(i), having the input terminals connected to the input terminal of the output buffer BUF(j). The main buffer section 214(i) includes a p-channel MOS (pMOS) transistor 220(i) and an n-channel MOS (nMOS) transistor 222(i). The pMOS transistor 220(i) has the gate terminal connected to the output terminal of the inverter 216(i), the source terminal connected to a terminal providing a supply voltage Vcc of the output buffer BUF(j) and the drain terminal connected to the drain terminal of the nMOS transistor 222(i). The nMOS transistor 222(i) has the gate terminal connected to the output terminal of the inverter 218(i) and the source terminal connected to a terminal providing a reference voltage (ground) of the output buffer BUF(j). The drain terminals of the transistors 220(i) and 222(i) are connected to the output terminal of the operative stage 210(i), and, thus, to the circuit load CL(j).

The output buffer BUF(j) further includes an auxiliary stage 224 for driving the selective activation and deactivation of the operative stages 210(i). The auxiliary stage 224, whose circuit structure will be described in more detail in the following of the present description, is connected to each operative stage 210(i) by means of an enabling bus En<1:n> formed by a number n of electric lines, each adapted to convey a digital signal that may take, for example, two distinct logical values. Particularly, the generic operative stage 210(i) is connected to the auxiliary stage 224 through the line En<i> of the enabling bus En<1:n>. Depending on the logic value taken by the signal conveyed on the line En<i>, the operative stage 210(i) may be activated or deactivated.

During the functioning of the electronic circuit, the digital signal DATA(j) varies in time, switching between a voltage value equal to the supply voltage Vcc (for example, associated with a "high" logic value) and a value equal to the ground voltage (for example, associated with a "low" logic value). The digital signal data (j) is provided to all the operative stages 210(i). If an operative stage 210(i) has been activated by the auxiliary stage 224, the digital signal DATA(j) is provided to the input terminals of the inverters 216(i) and 218(i). By supposing that at a certain instant of time the digital signal DATA(j) switches from the low logic value to the high logic value, the inverters 216(i) and 218(i) act accordingly, thereby providing a voltage signal corresponding to the low logic value, i.e., having a value equal to the ground voltage, to its output terminals. This voltage signal is thus provided to the gate terminals of the transistors 220(i) and 222(i). In this case, the nMOS transistor 222(i) is turned off, while the pMOS transistor 220(i) is turned on. The voltage value of the output terminal of the operative stage 210(i) tends to increase, until the voltage value of the supply voltage Vcc has been reached. This occurs thanks to the current coming from the terminal providing the supply voltage Vcc that flows through the pMOS transistor 220(i). Being the output terminal of the operative stage 210(i) connected to the output terminal of the output buffer BUF(j), also the latter will tend to reach a voltage level equal to the supply voltage Vcc. In other words, the buffered output signal DOUT(j) is driven to transition toward the high logic value. Since the operative stages 210(i) are connected in parallel, the whole current that loads the capacitances of the output terminal of the output buffer BUF(j) is composed by the currents that flow through the pMOS transistors 220(i) of the activated operative stages 210(i). The higher the number of activated operative stages 210(i), the quicker the phase of loading the output terminal of the output buffer BUF(j), and the quicker the switching of the buffered output signal DOUT(j).

The same considerations apply when the digital signal DATA(j) has to switch from the high logic value to the low logic value. In this case the buffered output signal DOUT(j) switches towards the low logic value thanks to the activation of the nMOS transistors 222(i) of the activated operative stages 210(i), whose currents allow discharging the capacitances of the output terminal of the output buffer BUF(j).

The output buffer BUF(j) is "self-adaptive", since the driving capability is automatically adjusted, in response to the variations of some pre-selected parameters that characterize the operation of the output buffer BUF(j).

As will be described in the following, the auxiliary stage 224 is capable of continually monitoring the driving capability of the output buffer BUF(j) and, if necessary, of modifying it. For this purpose, the auxiliary stage 224 includes an auxiliary buffer section (not shown) having a structure equal to the generic main buffer section 214(i). The current generated by the auxiliary buffer section is monitored by the auxiliary stage 224, which accordingly adjusts the driving capability of the output buffer BUF(j) as a function of the monitored current.

During the manufacturing process of the electronic circuit 100, the auxiliary buffer section is made as similar as possible to the generic main buffer section 214(i). Particularly, the sizes of the transistors that constitute the auxiliary buffer section are the same as those of the transistors 220(i) and 222(i). Furthermore, the auxiliary buffer section is physically implemented (on a semiconductor chip that integrates the electronic circuit) in the surrounding of the positions in which the operative stages 210(i) are made, in such a way that, during operation, they are subjected to the same temperature. Naturally, the auxiliary buffer section and the main buffer section receive the same supply voltage Vcc and the same ground voltage.

In this way, by performing measurement operations on the current that is drained/generated by the auxiliary buffer section it is possible to obtain a sufficiently reliable estimate of the current drained/generated by each main buffer section (214(i).

Thanks to this feature, the auxiliary stage 224 is capable of automatically sensing both any supply voltage Vcc or ground voltage and any temperature variations, and of responding to them in an efficient manner.

Furthermore, thanks to the fact that the transistors forming the auxiliary buffer section are practically equal to the transistors 220(i) and 222(i), the characteristics of the exploited process (like, for example, the oxide's thickness, the gains and the threshold voltages of the transistors) automatically reflect also on the auxiliary buffer section.

In addition, since the monitoring is executed through the auxiliary stage 224, and through an operative stage 210(i) connected to the load, the output buffer BUF(j) is not capacitively loaded by measuring circuits.

Figure 3:
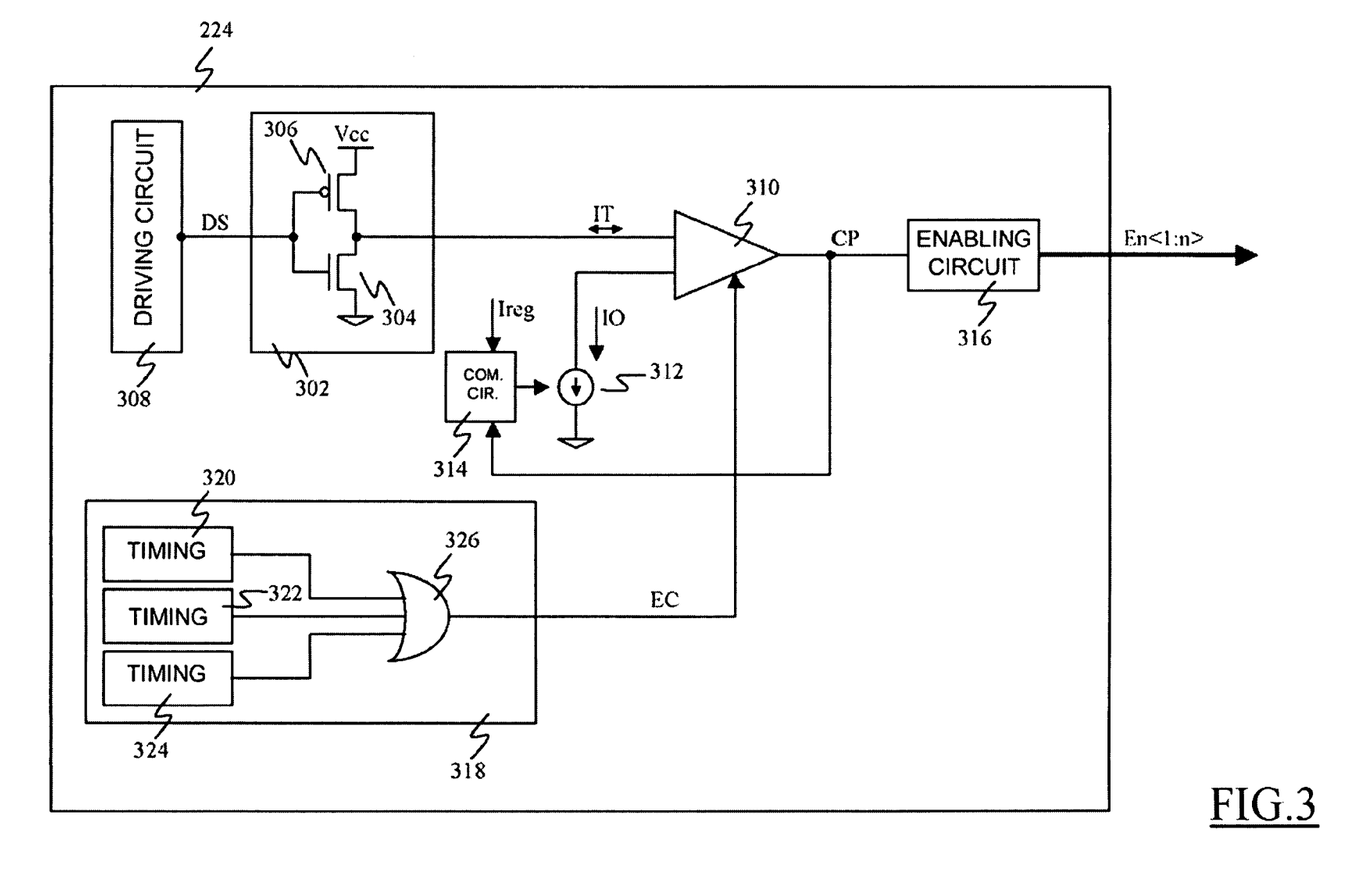
FIG. 3 illustrates in detail the circuit structure of an auxiliary stage included in the output buffer of FIG. 2 according to an embodiment of the invention.

FIG. 3 illustrates in detail the circuit structure of the auxiliary stage 224 according to an embodiment of the present invention.

The auxiliary stage 224 includes an auxiliary buffer section 302, which includes a nMOS transistor 304 and a pMOS transistor 306. Particularly, the nMOS transistor 304 has the source terminal that receives the ground voltage, and the drain terminal connected to the drain terminal of the pMOS transistor 306. The pMOS transistor 306 has the gate terminal connected to the gate terminal of the nMOS transistor 304 and the source terminal that receives the supply voltage Vcc. The gate terminals of the transistors 304 and 306 receive a driving signal DS from a driving circuit block 308. The drain terminals of the transistors 304 and 306 provide a control current IT to an input terminal of a current comparator 310.

The current comparator 310 has a further input terminal that receives a reference current IO, an output terminal that provides a digital comparing signal CP and an enabling terminal that receives an enabling signal EC.

The auxiliary stage 224 further includes a controlled current generator 312, which generates the reference current IO. The controlled current generator 312 has a first terminal connected to a terminal providing the ground voltage, a second terminal connected to the current comparator 310 and a control terminal connected to a command circuit 314. The command circuit 314 further receives the comparing signal CP and a regulation signal Ireg, for example, a voltage signal provided from the outside of the auxiliary stage 224. The voltage value of the regulation signal Ireg may be set by a user of the output buffer BUF(j) for the purpose of driving the circuit load CL(j) with a current having a desired intensity. Indeed, the command circuit 314 is adapted to set the intensity of the reference current IO, providing a voltage having a proper value to the control terminal of the controlled current generator 312 as a function of the regulation signal Ireg and the values taken by the comparing signal CP, as will be explained in detail in the following description.

The output terminal of the current comparator 310 is connected to an enabling circuit 316, adapted to drive the enabling bus En<1:n> depending on the value taken by the comparing signal CP.

The enabling signal EC is generated by a scanner circuit 318, which includes three timing blocks 320, 322 and 324 (described in the following). Particularly, each timing block 320, 322 and 324 has an output terminal connected to an input terminal of a logic OR gate 326. The enabling signal EC is provided by the output terminal of the OR gate 326.

The auxiliary stage 224 is capable of measuring both the current generated by the pMOS transistor 306 and the current drained by the nMOS transistor 304 independently. To this purpose, the driving signal DS generated by the driving circuit block 308 takes a voltage value equal to the supply voltage Vcc for measuring the current drained by the auxiliary buffer section 302, activating the nMOS transistor 304 and deactivating the pMOS transistor 306, or takes a voltage value equal to the ground voltage for measuring the current generated by the auxiliary buffer section 302, activating the pMOS transistor 306 and deactivating the nMOS transistor 304.

This feature is very useful, since if on a side the temperature and supply voltage Vcc variations act in a common mode on the section made with pMOS transistors and on those made with nMOS transistors, regarding instead the process variations, variations such as to make the transistors of one type much more (or much less) conductive than their nominal value may occur.

It is now supposed that the circuit load CL(i) has to be driven with a current flowing from the output terminal of the output buffer BUF(j) to the circuit load CL(j) having a desired nominal value INOM and, consequently, a corresponding desired driving capability (defined by the reference signal Ireg). In order to have the output buffer BUF(j) capable of providing a current having such intensity to the circuit load CL(j) in a satisfactory manner, the nominal value INOM has to be sufficiently lower than the highest current that the output buffer BUF(j) is capable of providing, i.e., than the current generated by the output buffer BUF(j) in the case where all the n operative stages 210(i) are activated. If this does not occur, and if the circuit load CL(j) were driven by a current exactly equal to the highest current the output buffer BUF(j) is capable of providing, even a small worsening or degradation of the corresponding parameters would be sufficient to prevent the obtaining of the desired driving capability.

Firstly, all the n operative stages 210(i) of the output buffer BUF(j) are activated, in such a way that the circuit load CL(j) receives the highest current that can be provided. In these conditions, in order to have the total current provided by the output buffer BUF(j) exactly equal to the nominal value INOM, each operative stage would be capable of providing a current of value equal to INOM/n. For this purpose, the command circuit 314 controls the current generator 312, in such a way that the reference current IO is forced to reach a value equal to INOM/n.

The driving signal DS is thus driven to the ground voltage, and the control current IT flows from the terminal providing the supply voltage Vcc toward the current comparator 310 through the pMOS transistor 306. The intensity of the control current IT is compared with the reference current IO, whose value is equal to INOM/n. The result of the comparison between the control current IT and the reference current IO, represented by the value taken by the comparing signal CP, is provided to the enabling circuit 316, which accordingly drives the enabling bus En<1:n>.

If the control current IT has a value higher than the one of the reference current IO, it means that each operative stage 210(i) provides a current having a value higher than INOM/n. Consequently, the intensity of the current provided to the output load CL(j), formed by the sum of the currents of the n operative stages 210(i) being activated, is higher than the desired one. In other words, the driving capability of the output buffer is too high, and thus it is necessary to reduce the number of activated operative stages 210(i). For this purpose, the comparing signal CP is asserted (for example, to the high logic value), and the enabling circuit 316 is driven for activating one less operative stage, in such a way that the corresponding line EN<i> of the enabling bus En<1:n> is deasserted. The comparing signal CP is further provided to the driving circuit 314, which acts on the controlled current generator 312 for forcing the value of the reference current IO to the value INOM/(n−1). Later on, a new measurement of the control current IT is performed. If the control current IT has a value that is higher than the new value taken by the reference current IO, i.e., INOM/(n−1), a further operative stage is deactivated, with a consequent further reduction of the driving capability. The procedure is repeated until the value of the control current IT reaches the one taken by the reference current IO; in this condition, the value of the control current IT multiplied by the number of activated operative stages 210(i) (i.e., the intensity of the total current provided to the output load CL(j)) equals the desired value INOM.

Naturally, it is not necessary to update the number of operative stages 210(i) to be activated/deactivated through the enabling circuit 316 at every cycle of the procedure described above. Indeed, this can be performed also at the end of the procedure, when such number has been set, i.e., only when the value of the control current IT has reached the value taken by the reference current IO.

Similar considerations apply in case the driving signal DS is equal to the supply voltage Vcc, i.e., when the control current IT flows from the current comparator 310 toward the terminal providing the ground voltage through the nMOS transistor 304.

While for monitoring the variations of the process parameters a single measuring procedure would be enough, for example, at the turning on of the electronic circuit 100, the temperature and the value of the supply voltage Vcc may vary during the operation of the circuit. Consequently, the monitoring of the driving capability of the output buffer BUF(j) has to be executed for the whole duration of the operation of the circuit. The monitoring is timed by the enabling signal EC. When the enabling signal EC is asserted, for example, to the high logic value, the current comparator 310 compares the input currents, providing a corresponding comparing signal CP, while otherwise it remains deactivated.

The enabling signal EC is given by the result of the logic disjunction operation of the signals generated by the timing blocks 310, 322 and 324.

The timing block 320 generates a voltage pulse having a value equal to the supply voltage Vcc at the turning on of the electronic circuit 100. This voltage pulse is provided to the OR gate 326, and thus transmitted to the current comparator 310. As a consequence, the current comparator 310 is activated at the turning on of the electronic circuit, and remains activated for the whole pulse duration. Naturally, the timing block 320 has to be capable of generating a pulse having a time duration that it is sufficiently long for keeping active the current comparator 310 for the whole duration of the measuring procedure of the control current IT.

The purpose of the timing block 322 is the activation of the current comparator 310 for monitoring the driving capability according to the temperature variations. As previously anticipated, the temperature may vary also after the turning on of the electronic circuit. For this purpose, the timing block 322 generates a signal that is composed by a train of voltage pulses. At each voltage pulse provided to the OR gate 326, the current comparator 310 is activated, and the control current IT is measured. Since the temperature varies in a relatively slow way, the voltage pulses are generated by the timing block 322 at a slow frequency. For example, the timing block 322 may generate a voltage pulse every 5-10 ms.

The purpose of the timing block 324 is instead the activation of the current comparator 310 for monitoring the driving capability according to the supply voltage Vcc variations. Differently than in the case of the temperature, the supply voltage Vcc may be subjected to very quick variations. According to an embodiment of the present invention, the timing block 324 continually monitors the supply voltage Vcc, and generates a voltage pulse (that activates the measure of the control current IT) at each variation thereof.

Figure 4:
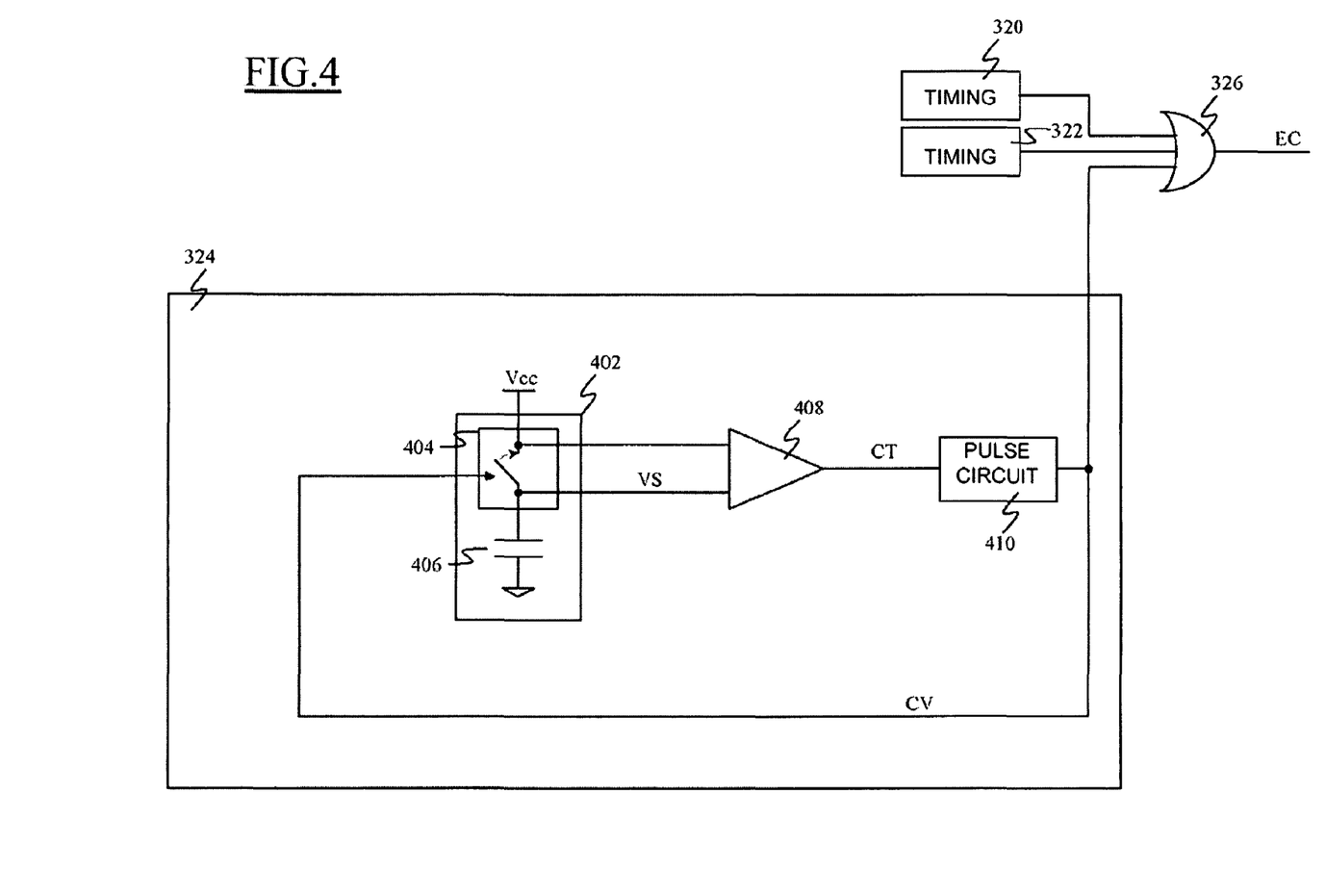
FIG. 4 illustrates the circuit structure of a timing block included in the auxiliary stage according to an embodiment of the present invention.

FIG. 4 illustrates in detail the circuit structure of the timing block 324, according to an embodiment of the present invention.

The timing block 324 includes a sample and hold circuit 402, adapted to sample the supply voltage Vcc and to store the sampled value. The sample and hold circuit 402 includes a controlled electronic switch 404 and a voltage register 406 (for example, implemented by a capacitor). The controlled electronic switch 404 has a first terminal connected to the terminal providing the supply voltage Vcc, a second terminal connected to a first terminal of the voltage register 406 for providing a sampled voltage VS, and a control terminal for receiving a sampling pulse CV. The voltage register 406 has a second terminal that receives the ground voltage.

The timing block 324 further includes a voltage comparator 408 being cascade connected to a pulser circuit 410. The voltage comparator 408 has two input terminals connected to the terminals of the controlled electronic switch 404, and an output terminal connected to an input terminal of the pulser circuit 410 for providing a voltage comparing signal CT. The pulser circuit 410 has an output terminal that provides the sampling pulses CV, which is connected to the control terminal of the controlled electronic switch 404 and to the OR gate 326.

The voltage comparator 408 is characterized by a sensing threshold SV (for example, equal to 10-100 mVolts). When the voltage difference (in absolute value) between the signals applied to its input terminals exceeds the value of the sensing threshold SV, the voltage comparing signal CT output by the voltage comparator 408 is asserted (for example, to the high logic value), and the pulser circuit 410 provides a sampling pulse CV of predefined duration to the output terminal. The sampling pulse is provided to the current comparator (not shown in the Figure) through the OR gate 326, for enabling the measure of the control current IT.

Figure 5:
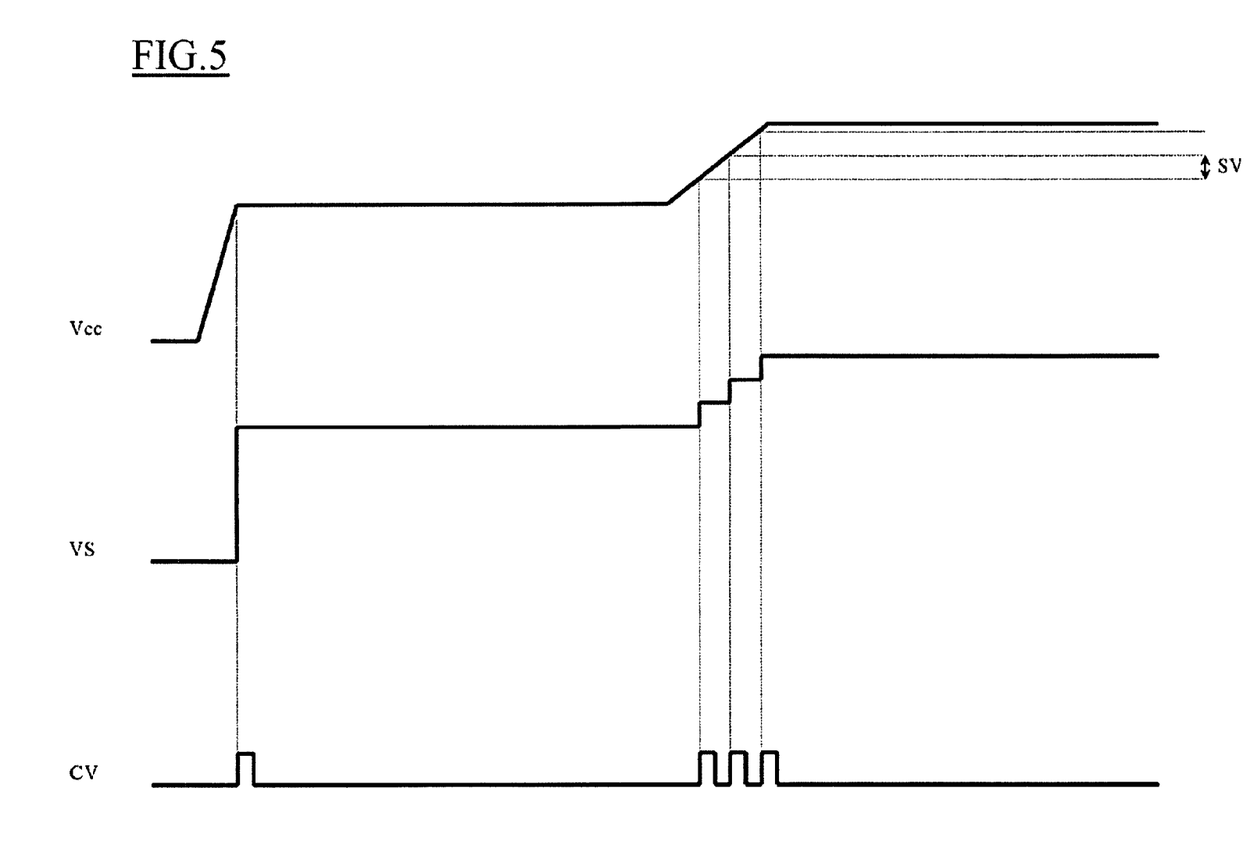
FIG. 5 is a timing diagram in which the time patterns of the main signals involved in the operation of the auxiliary stage are shown according to an embodiment of the invention.

In order to describe the operation of the timing block 324, reference will be now made, in conjunction with the FIG. 4, to the timing diagram illustrated in the FIG. 5, in which the timing patterns of the main signals exploited are shown.

At the turning on of the electronic device, the supply voltage Vcc takes a time interval for reaching its nominal value (for example, 3.3 Volts). At the end of such time transient, the controlled electronic switch 404 closes. In this way, the voltage register 406 receives the supply voltage Vcc at its terminal, and stores its value (the sampled voltage VS takes the value of the supply voltage Vcc). The controlled electronic circuit 404 is opened, interrupting every conductive path between the terminal providing the supply voltage Vcc and the first terminal of the voltage register 406. The sampled supply voltage Vcc value remains stored in the voltage register, through the sampled voltage VS.

Afterwards, while the electronic switch 404 remains open, the voltage comparator 408 sees the supply voltage Vcc applied to the first input terminal. In these conditions the voltage comparing signal CT is deasserted, and the pulser circuit 410 does not provide any sampling pulse CV. Consequently, the enabling signal EC output by the OR gate 326 remains deasserted (except in case the other timing blocks 320 or 322 provide one of the voltage pulses).

When the supply voltage value Vcc is subjected to a variation, with respect to the sampled voltage VS, higher than the sensing threshold SV (in the example shown in the FIG. 5, said variation is a positive increase, but the same considerations apply for a decrement of the supply voltage Vcc), the voltage comparator 408 asserts the voltage comparing signal CT. Consequently, the pulser circuit 410 provides a sampling pulse CV to the OR gate 326, enabling a new measure of the control current IT, necessary because of the variations of the electric conditions of the output buffer caused by the supply voltage variation.

The sampling pulse CV is further provided to the control terminal of the controlled electronic switch 404, which closes, thereby connecting the terminal providing the supply voltage Vcc with the first terminal of the voltage register 406. In this way, the value of the sampled voltage VS is updated to the new value that the supply voltage Vcc has reached.

Consequently, when the controlled electronic circuit 404 is opened again (at the end of the sampling pulse CV), the voltage comparator 408 sees at the second input terminal an updated sampled voltage VS, which will be exploited for the comparison with the supply voltage Vcc until the controlled electronic circuit 404 will be again driven to close.

In this way, every time the supply voltage Vcc is subjected to a variation equal to or higher than the sensing threshold SV with respect of the value previously sampled, a new measure of the control current is enabled, i.e., the driving capability is evaluated.

For example, similar considerations apply if the output buffer has an equivalent structure. Particularly, the operative stages 210 may be in a different number or made with other components (for example, by substituting the MOS transistors with bipolar transistors).

Although in the description the output buffer is composed by two buffer sections being cascade connected, nothing prevents adding auxiliary buffer sections, each one adapted to be monitored by means of a dedicated auxiliary buffer section.

Moreover, the measuring of the control current and/or the enabling of the operative stages may be implemented in an equivalent way.

in another embodiment the output buffer is modified in such a way to allow the activation of the circuit sections formed by pMOS transistors and the circuit sections formed by nMOS transistors in a separate way. In this way, it would be possible to act on the control of the driving capability for transitions from the high logic value to the low logic value and on the control of the driving capability for transitions from the low logic value to the high logic value.

Without departing from the principles of the invention, it is also possible to size the auxiliary stage in a different way, or providing two or more of it.

Nothing prevents applying the proposed solution in a partial way, for regulating only the current that is drained by or provided to the output buffer.

Alternatively, the control current may be compared with different reference currents in a parallel way.

In a simplified embodiment, it is also possible to activate only some of the timing modalities described above.

In any case, the control may be activated by a similar event related to the turning on of the circuit (or of a part thereof.

Likewise, the same operation may be activated with a different periodicity.

Similar considerations apply if the supply voltage is measured in an equivalent way.

Alternatively, it is possible to provide a non-continual control.

Obviously, the threshold value of the comparator used for such purpose is purely indicative and is not to be intended in a limitative manner.

Similar considerations apply if the electronic circuit includes a single output terminal, and a corresponding single output buffer.

Naturally, in order to satisfy local and specific requirements, a person skilled in the art may apply to the solution described above many modifications and alterations. Particularly, although the present invention has been described with a certain degree of particularity with reference to embodiments thereof, it should be understood that various omissions, substitutions and changes in the form and details as well as other embodiments are possible. Moreover, it is expressly intended that specific elements and/or method steps described in connection with any disclosed embodiments of the invention may be incorporated in other embodiments as a general matter of design choice.

From the foregoing it will be appreciated that, although specific embodiments of the invention have been described herein for purposes of illustration, various modifications may be made without deviating from the spirit and scope of the invention.1

The invention claimed is:

1. An output buffer for providing a buffered current to a circuit load, the output buffer comprising:
   a plurality of operative stages, each one for generating a current component of the buffered current; and
   enabling means for selectively enabling each operative stage;
   at least one auxiliary stage; and
   control means for measuring a control current supplied by the at least one auxiliary stage, the control means operable to cause the enabling means to selectively enable at least one operative stage according to the measured control current.

2. The output buffer of claim 1, wherein all the operative stages are equivalent to each other, and the at least one auxiliary stage consists of a single auxiliary stage equivalent to each operative stage.

3. The output buffer of claim 1, wherein:
   the auxiliary stage includes a first circuit branch and a second circuit branch for alternatively providing the control current, the first circuit branch including transistors of a first type and the second circuit branch including transistors of a second type opposite to the first type, the polarity of the control current provided by the first branch being opposite to the polarity of the control current provided by the second branch; and wherein
   the control means is adapted to alternatively measure the control current provided by the first branch or the control current provided by the second branch.

4. The output buffer of claim 3, wherein the control means includes means for providing a reference current, means for adjusting the reference current, and means for comparing the control current with the reference current.

5. The output buffer of claim 1, further comprising means for activating the control means in response to a turning on of the output buffer.

6. The output buffer of claim 1, further comprising means for periodically activating the control means.

7. The output buffer of claim 1, further comprising means for measuring a supply voltage to the output buffer, and means for activating the control means according to the measured supply voltage.

8. The output buffer of claim 7, wherein the means for measuring the supply voltage includes:
   means for storing a comparing voltage;
   means for comparing the supply voltage with the comparing voltage, the control means measuring the control current in response to the comparison between the supply voltage and the comparing voltage; and means for updating the comparing voltage to the supply voltage in response to each measuring by the control means.

9. The output buffer of claim 8, wherein the means for comparing the supply voltage with the comparing voltage include means for determining the reaching of a threshold value by the difference between the supply voltage and the comparing voltage, the control means measuring the control current in response to the reaching of the threshold.

10. An electronic circuit comprising means for providing at least one output signal, and at least one output buffer according to claim 1, each one for providing the buffered current for a corresponding output signal.

11. A method for providing a buffered current to a circuit load, the method comprising the steps of:
generating a plurality of current components of the buffered current through corresponding operative stages;
selectively enabling each operative stage by means of enabling means; and
measuring a control current delivered by at least one auxiliary stage;
wherein the enabling means selectively enables each operative stage according to the measured control current.

12. An output buffer operable to provide an output current on an output node adapted to be coupled to a load, the output buffer comprising:
a plurality of operative stages, each operative stage configured to receive a corresponding active or inactive enable signal, and each operative stage operable to provide a portion of the output current when the enable signal is active and to disable providing the portion of the output current when the enable signal is inactive; and
an enabling circuit coupled to the operative stages, the enabling circuit including an auxiliary stage having substantially the same configuration as each of the operative stages, and the enabling circuit operable to detect a control current provided by the auxiliary circuit and in response to the detected control current operable to selectively cause the enable signals applied to the operative stages to be active or inactive.

13. The output buffer of claim 12 wherein each operative stage provides a source current on the output node when the node is to be driven high and provides a sink current on the output node when the node is to be driven low.

14. The output buffer of claim 12 wherein the enabling circuit is further configured to receive a regulation signal and is operable responsive to the regulation signal to adjust the number of operative stages that receive an active enable signal and the number of operative stages that receive and inactive enable signal.

15. The output buffer of claim 14 wherein the enabling circuit is further operable to generate a reference current having a value that is a function of the regulation signal and the auxiliary stage is operable to generate a control current, and wherein the enabling circuit is further operable to compare the reference current to the control current and to adjust the number of active enable signals responsive to this comparison.

16. The output buffer of claim 15 wherein the enabling circuit is operable to compare the reference current to the control current responsive to a startup condition of the output buffer.

17. The output buffer of claim 15 wherein the output buffer receives a supply voltage and wherein the enabling circuit is operable to compare the reference current to the control current responsive to a variation in the supply voltage by a predetermined amount.

18. The output buffer of claim 15 wherein the enabling circuit is operable to compare the reference current to the control current at predetermined time intervals to thereby adjust the number of active and inactive operative stages as a function of temperature of the operative stages.

19. The output buffer of claim 12 wherein each operative stage comprises a PMOS transistor and an NMOS transistor connected in series between a supply voltage source and a reference supply voltage source, and wherein the gate of each transistor is configured to receive a data input signal and a node defined at the interconnection of the drain of the two transistors is coupled to the output node.

20. An electronic system, comprising:
electronic circuitry including a system bus; and
a plurality of output buffers having output nodes coupled to the system bus to provide an output current on the system bus, each output buffer including,
a plurality of operative stages, each operative stage configured to receive a corresponding active or inactive enable signal, and each operative stage operable to provide a portion of the output current when the enable signal is active and to disable providing the portion of the output current when the enable signal is inactive; and
an enabling circuit coupled to the operative stages, the enabling circuit including an auxiliary stage having substantially the same configuration as each of the operative stages, and the enabling circuit operable to detect a control current that can be provided by the auxiliary circuit and in response to the detected control current operable to selectively provide the active and inactive enable signals applied to the operative stages.

21. The electronic system of claim 20 wherein the electronic circuitry comprises computer circuitry.

22. A method of controlling an output current to be provided on an output node, the method comprising:
generating a plurality of output current portions, the sum of the output current portions being equal to the output current and a value of each output current portion being a function associated electrical parameters;
generating a control current having a value that is a function of the same associated electrical parameters;
comparing the control current to a reference current; and
adjusting a number of generated output current portions responsive to the operation of comparing to thereby control the value of the output current.

23. The method of claim 22 wherein the operation of comparing is performed periodically, as a function of variation in a supply voltage, and responsive to a startup condition of an output buffer being detected.

* * * * *

UNITED STATES PATENT AND TRADEMARK OFFICE
CERTIFICATE OF CORRECTION

PATENT NO. : 7,548,098 B2
APPLICATION NO. : 11/717853
DATED : June 16, 2009
INVENTOR(S) : Ignazio Martines and Michele La Placa It is certified that error appears in the above-identified patent and that said Letters Patent is hereby corrected as shown below:

- In Claim 22, Column 12, Line 50 of the patent, please insert the text -- of -- after the text "a function" and before the text "associated electrical parameters".

Signed and Sealed this

Twelfth Day of October, 2010

David J. Kappos
*Director of the United States Patent and Trademark Office*